US007352249B2

(12) United States Patent
Balboni et al.

(10) Patent No.: US 7,352,249 B2
(45) Date of Patent: Apr. 1, 2008

(54) PHASE-LOCKED LOOP BANDWIDTH CALIBRATION CIRCUIT AND METHOD THEREOF

(75) Inventors: Edmund J. Balboni, Littleton, MA (US); Wyn T. Palmer, Reading, MA (US); Jonathan R. Strange, Reigate (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/679,023

(22) Filed: Oct. 3, 2003

(65) Prior Publication Data

US 2005/0073369 A1 Apr. 7, 2005

(51) Int. Cl.
*H03L 7/085* (2006.01)
(52) U.S. Cl. .............................. 331/16; 331/17; 327/157
(58) Field of Classification Search ................ 332/127, 332/100; 331/17, 16, 25; 327/156, 157
See application file for complete search history.

(56) References Cited

U.S. PATENT DOCUMENTS 5,986,512 A * 11/1999 Eriksson ...................... 331/16
6,163,184 A 12/2000 Larsson ....................... 327/156
6,476,681 B1 * 11/2002 Kirkpatrick .................. 331/17
2002/0039050 A1 4/2002 Griffith et al. ................ 331/17
2002/0075091 A1 * 6/2002 Lo et al. .................. 331/177 V
2002/0167367 A1 * 11/2002 Ingino, Jr. ................. 331/186

FOREIGN PATENT DOCUMENTS

DE 10132799 10/2002
WO WO 2004/027997 4/2004

OTHER PUBLICATIONS

"Modulation and Frequency Synthesis for Wireless Digital Radio," Walter T. Bax. *Carleton University*. Ottawa-Carleton Institute of Electrical Engineering, Department of Physics. Oct. 1999.

* cited by examiner

*Primary Examiner*—Joseph Chang
(74) *Attorney, Agent, or Firm*—Gauthier & Connors LLP

(57) ABSTRACT

A phase-locked loop frequency synthesizer has a charge pump, phase-locked loop filter, voltage-controlled oscillator, and a bandwidth calibration circuit. The bandwidth calibration circuit measures the gain of the voltage-controlled oscillator and uses the measured voltage-controlled oscillator gain to adjust the charge pump level. The charge pump level is adjusted so that a product of the voltage-controlled oscillator gain and the measured charge pump level results in a constant phase-locked loop bandwidth.

15 Claims, 9 Drawing Sheets

PHASE-LOCKED LOOP BANDWIDTH CALIBRATION CIRCUIT AND METHOD THEREOF

FIELD OF THE PRESENT INVENTION

The present invention is directed to a frequency synthesizer having a phase-locked loop and voltage-controlled oscillator. More particularly, the present invention is directed to a frequency synthesizer having a phase-locked loop bandwidth calibration circuit that establishes a phase-locked loop bandwidth quickly based upon an external frequency reference.

BACKGROUND OF THE PRESENT INVENTION

Phase-locked loops are used in a variety of applications such as clock recovery, frequency and phase modulation, and frequency synthesizers. A voltage-controlled oscillator is a central design element of the phase-locked loop, whereby the voltage-controlled oscillator produces an output frequency proportional to its input voltage.

A typical drawback of a voltage-controlled oscillator is its uncertainty in output frequency to the applied input voltage due to integrated circuit process variations. This leads to the need for a voltage-controlled oscillator having a large gain to provide the desired frequencies. The large voltage-controlled oscillator gain also has the effect of producing a large variation in the output frequency in response to any noise in the applied input voltage, also known as phase noise. This phase noise at the voltage-controlled oscillator output is undesirable as this limits the purity of the output signal.

As noted above, a common application of voltage-controlled oscillators are within wireless communication systems. Wireless communication systems typically require frequency synthesis in both the receive path circuitry and the transmit path circuitry. For example, cellular phone standards in the United States and Europe define a cellular telephone system with communication centered in two frequency bands at about 900 MHz and 1800 MHz.

A dual band cellular phone is capable of operating in both the 900 MHz frequency band and the 1800 MHz frequency band. Within the frequency bands, the cellular standards define systems in which base station units and mobile units communicate through multiple channels, such as 30 kHz (IS-54) or 200 kHz (GSM) wide channels. For example, with the IS-54 standard, approximately 800 channels are used for transmitting information from the base station to the mobile unit, and another approximately 800 channels are used for transmitting information from the mobile unit to the base station. A frequency band of 869 MHz to 894 MHz and a frequency band of 824 MHz to 849 MHz are reserved for these channels, respectively.

Because the mobile unit must be capable of transmitting and receiving on any of the channels for the standard within which it is operating, a frequency synthesizer must be provided to create accurate frequency signals in increments of the particular channel widths, such as for example 30 kHz increments in the 900 MHz region.

Phase-locked loop circuits including voltage-controlled oscillators are often used in mobile unit applications to produce the desired output frequency. An example of a phase-locked loop circuit in mobile applications is illustrated in FIGS. 1 and 2.

FIG. 1 is a block diagram example of a receive path circuitry 150 for a prior art wireless communication device, such as a mobile unit in a cellular phone system. An incoming signal is received by the antenna 108, filtered by a band-pass filter 110, and amplified by a low noise amplifier 112. This received signal is typically a radio-frequency signal, for example a 900 MHz or 1800 MHz signal. This radio-frequency signal is usually mixed down to a desired intermediate frequency before being mixed down to baseband. Using a reference frequency ($f_{REF}$) 106 from a crystal oscillator 105, frequency synthesizer 100 provides an RF mixing signal ($RF_{OUT}$) 102 to mixer 114. Mixer 114 combines this $RF_{OUT}$ signal 102 with the filtered and amplified input signal 113 to produce a signal 115 that has two frequency components. The signal is filtered by band-pass filter 116 to provide an IF signal 117. This IF signal 117 is then amplified by variable gain amplifier 118 before being mixed down to baseband by mixers 122 and 124.

Signal processing in mobile phones is typically conducted at baseband using in-phase (I) and quadrature (Q) signals. The Q signal is offset from the I signal by a phase shift of 90 degrees. To provide these two signals, an IF mixing signal 104 and a dual divide-by-two and quadrature shift block 120 may be utilized. Frequency synthesizer 100 generates an $IF_{OUT}$ signal 104; for example, at about 500 MHz; that is divided by 2 in block 120 to provide mixing signals 119 and 121. Block 120 delays the signal 121 to mixer 122 by 90 degrees with respect to the signal 119 to mixer 124.

Block 120 may be implemented with two flip-flop circuits operating off of opposite edges of the signal 104, such that the output of the flip-flops are half the frequency of the signal 104 and are 90 degrees offset from each other. The resulting output signals 123 and 125 have two frequency components.

Assuming the baseband frequency is centered at DC, the signal is filtered using low-pass filters 126 and 128. The resulting baseband signal 123 is the Q signal, and the resulting baseband signal 125 is the I signal. These signals 123 and 125 may be further processed at baseband by processing block 130 and provided to the rest of the mobile phone circuitry as I and Q signals 131 and 132.

FIG. 2 is a block diagram of a prior art phase-locked loop circuitry 200 for synthesizing one of the frequencies required by frequency synthesizer 100. A second phase-locked loop circuit may be implemented to provide the second frequency.

The reference frequency 106 is received by a divide-by-R counter 204, and the output frequency 102 is received by a divide-by-N counter 214. The resulting divided signals 216 and 218 are received by a phase detector 206. The phase detector 206 determines the phase difference between the phase of the divided signal 216 and the phase of the divided signal 218. The phase detector 206 uses this phase difference to drive a charge pump 208. The charge pump 208 provides a voltage output that is filtered by a loop filter 210 to provide a voltage control signal 220. The voltage control signal 220 controls the output frequency 102 of a voltage-controlled oscillator 212.

For a typical mobile phone application, the frequency 104 will remain constant, while the frequency 102 will change depending upon the channel of the incoming signal. Thus, a first phase-locked loop may be used to provide the frequency 104, and its N and R values may be programmed once and then left alone. A second phase-locked loop may be used to provide the frequency 102, and its N and R values may be selectively programmed to provide the desired signal 102. If desired, the R value for this second phase-locked loop may be programmed once and left alone, while the N value may be used to select the desired signal 102.

The typical transmit path circuitry (not shown) for a wireless communication device, such as a mobile unit in a cellular phone system, may include circuitry to move the outgoing signal from baseband to an RF transmission frequency. A transmit frequency band for cellular phone systems typically includes the identical number of channels as included within the receive frequency band. The transmit channels, however, are shifted from the receive channels by a fixed frequency amount.

As noted above, the phase-locked loop circuitry typically utilizes a phase detector to monitor phase differences between the divided reference frequency and the divided output frequency to drive a charge pump. The charge pump delivers packets of charge proportional to the phase difference to a loop filter.

The loop filter outputs a voltage that is connected to the voltage-controlled oscillator to control its output frequency. The action of this feedback loop attempts to drive the phase difference to zero to provide a stable and programmable output frequency. The values for the reference frequency and the divider circuits may be chosen depending upon the standard under which the mobile unit is operating.

The performance of the communication system, however, is critically dependent on the purity of the synthesized high-frequency output signals. For signal reception, impure frequency sources result in mixing of undesired channels into the desired channel signal. For signal transmission, impure frequency sources create interference in neighboring channels and limit a receivers ability to recover the transmitted data.

A frequency synthesizer, therefore, must typically meet very stringent requirements for spectral purity. The level of spectral purity required in cellular telephone applications makes the design of a phase-locked loop frequency synthesizer solution quite demanding.

Three types of spectral impurity will typically occur in voltage-controlled oscillator circuits that are used in phase-locked loop implementations for frequency synthesis: harmonic distortion terms associated with output frequency, spurious tones near the output frequency, and phase noise centered on the output frequency.

Generally, harmonic distortion terms are not too troublesome because harmonic distortion terms occur far from the desired fundamental and harmonic distortion terms' effects may be eliminated in cellular phone circuitry external to the frequency synthesizer.

Spurious tones, however, often fall close to the fundamental. Spurious tones, including reference tones, may be required by a cellular phone application to be less than about −70 dBc, while harmonic distortion terms may only be required to be less than about −20 dBc. It is noted that the "c" indicates the quantity as measured relative to the power of the "carrier" frequency, which is the output frequency.

Phase noise is undesired energy spread continuously in the vicinity of the output frequency. Phase noise can be the most damaging of the three to the spectral purity of the output frequency.

The phase-locked loop bandwidth has a strong impact on both phase-locked loop noise and on phase-locked loop settling time. In general, a wider bandwidth will lead to faster settling but will result in higher noise. Typically the phase-locked loop bandwidth can vary by +/−80% or more due to integrated circuit component tolerances. In turn, the varying of the phase-locked loop bandwidth causes less control in phase-locked loop settling time and in phase-locked loop noise.

Therefore, it is desirable to integrate a phase-locked loop with a voltage-controlled oscillator that provides a reduced variation in the phase-locked loop bandwidth. Moreover, it is desirable to provide an integrated phase-locked loop and a voltage-controlled oscillator, which enables a quick set-time of the phase-locked loop bandwidth. Lastly, it is desirable to provide an integrated phase-locked loop and a voltage-controlled oscillator that is capable of setting a phase-locked loop bandwidth quickly using only an external frequency reference.

SUMMARY OF THE PRESENT INVENTION

A first aspect of the present invention is a phase-locked loop bandwidth calibration circuit. The phase-locked loop bandwidth calibration circuit includes a programmable charge pump; a phase-locked loop filter operatively connected to the programmable charge pump; an oscillator, operatively connected to the phase-locked loop filter, to generate a frequency signal based upon a signal received from the phase-locked loop filter; and a control loop operatively connected to the phase-locked loop filter and the programmable charge pump. The control loop controls the programmable charge pump to adjust its output current level based on a measured gain of the oscillator.

A second aspect of the present invention is a phase-locked loop circuit. The phase-locked loop circuit includes a programmable charge pump; a phase-locked loop filter operatively connected to the programmable charge pump; and an oscillator, operatively connected to the phase-locked loop filter, to generate a frequency signal based upon a signal received from the phase-locked loop filter. The programmable charge pump has a resistive value; the phase-locked loop filter has a resistive value; and the resistive value of the programmable charge pump is matched to the resistive value of the phase-locked loop filter.

A third aspect of the present invention is a method of calibrating a phase-locked loop bandwidth. The method sets a phase-locked loop at a local oscillator offset; allows the phase-locked loop to settle; measures a first input voltage of a voltage-controlled oscillator located in the phase-locked loop; sets the phase-locked loop to a channel center frequency; allows the phase-locked loop to settle; measures a second input voltage of the voltage-controlled oscillator; determines a difference between the first and second voltage measurements; and controls a programmable charge-pump circuit located in the phase-locked loop to adjust its output current level based on the determined gain difference.

A fourth aspect of the present invention is a system for processing received radio-frequency signals. The system includes a receiver to receive the radio-frequency signals; a mixing unit to mix down the received radio-frequency signals to baseband; a frequency synthesizer to generate signals used by the mixing unit in mixing down the received radio-frequency signals to baseband; a filtering unit to lowpass filter the baseband radio-frequency signals; and a RC calibration unit to determine R and C values of the filtering unit so as to calibrate pole & zero frequencies of the filtering unit. The frequency synthesizer includes a phase-locked loop circuit having a programmable charge pump, a phase-locked loop filter operatively connected to the programmable charge pump, and an oscillator, operatively connected to the phase-locked loop filter, to generate a frequency signal based upon a signal received from the phase-locked loop filter. The RC calibration unit uses the determined R and C values to calibrate pole & zero frequencies of the phase-locked loop filter.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAIL DESCRIPTION OF THE PRESENT INVENTION

As noted above, the present invention contemplates a method and apparatus for synthesizing high-frequency signals by implementing a phase-locked loop frequency synthesizer with a voltage controlled oscillator.

A more detail description of such a method and apparatus for synthesizing high-frequency signals by implementing a phase-locked loop frequency synthesizer with a voltage controlled oscillator is set forth in co-pending patent application Ser. No. 10/230,763, filed on Aug. 29, 2002, entitled "Method Of Modulation Gain Calibration And System Thereof." The entire content of co-pending patent application, Ser. No. 10/230,763, filed on Aug. 29, 2002, is hereby incorporated by reference.

Figure 1:
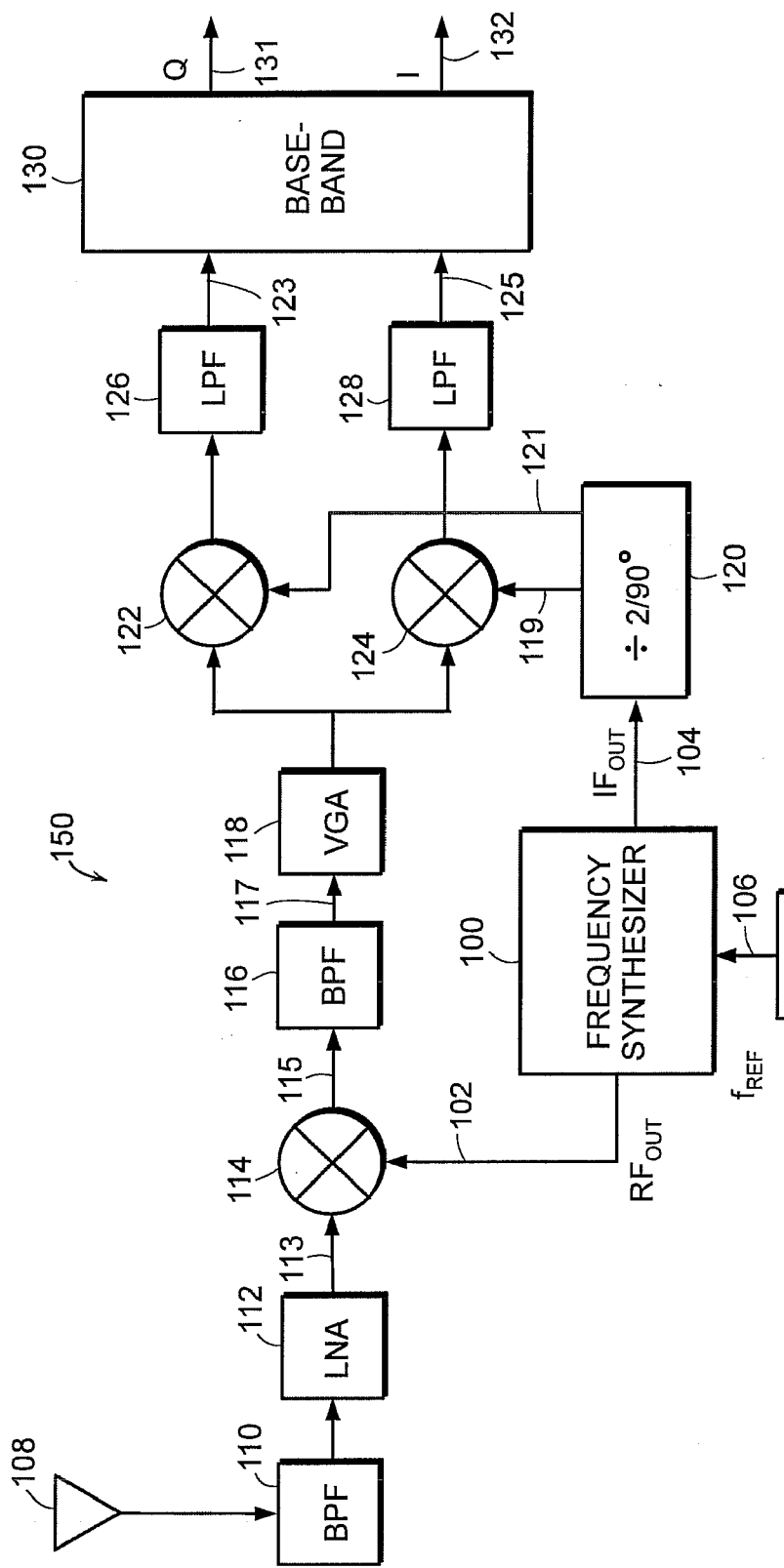
FIG. 1 illustrates a prior art receive path for a wireless communication device.
Figure 2:
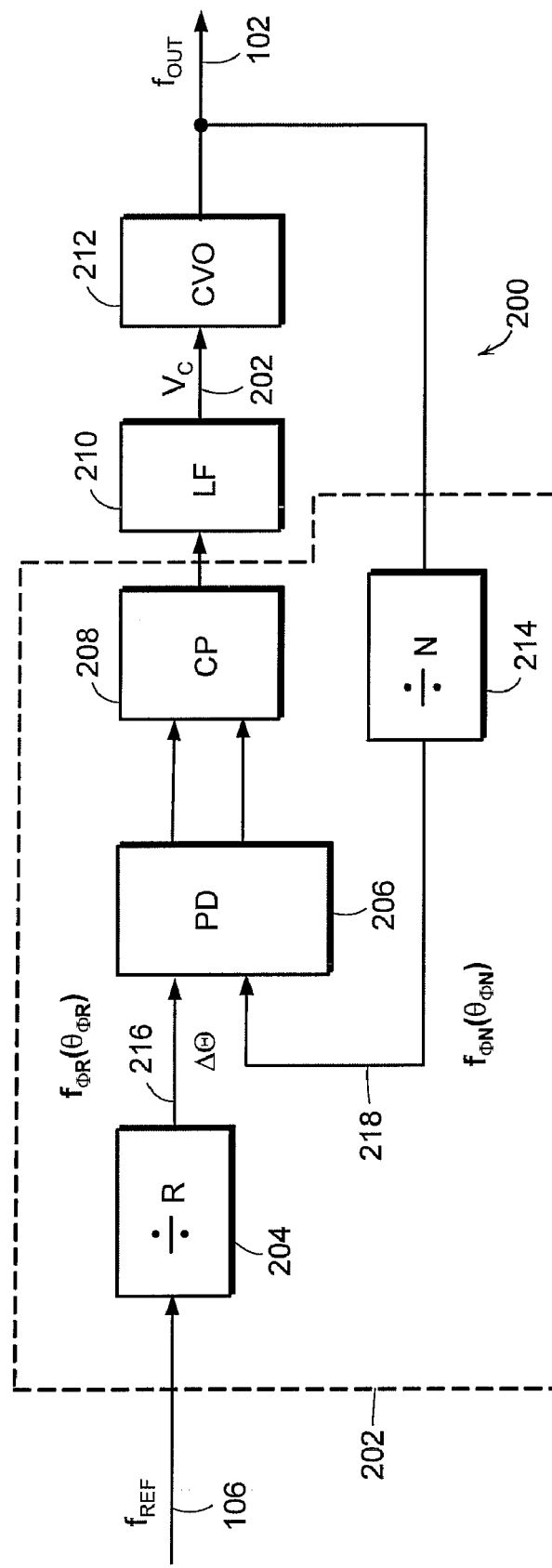
FIG. 2 illustrates a prior art phase-locked loop for synthesizing one of the frequencies required by a frequency synthesizer.
Figure 3:
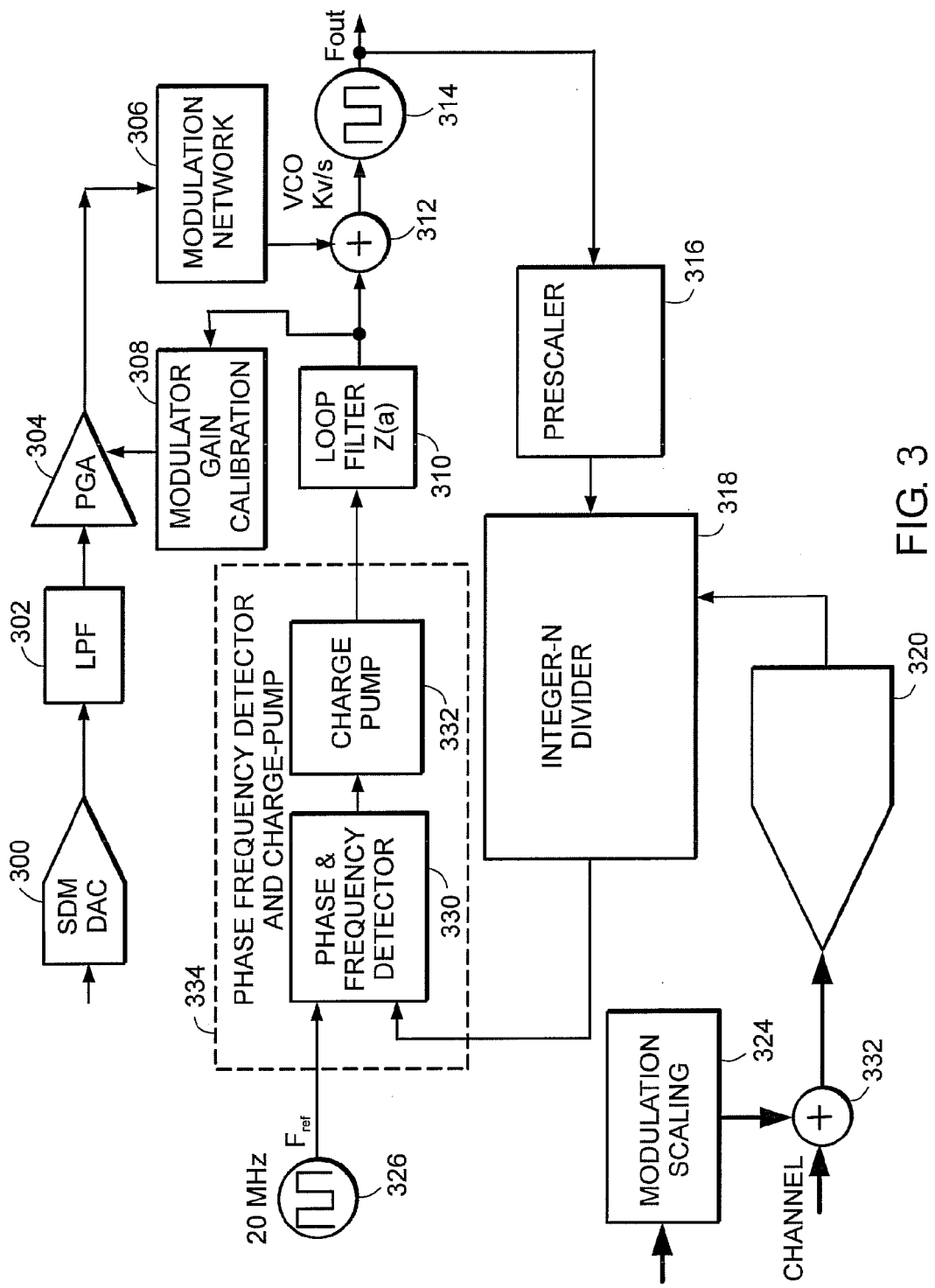
FIG. 3 illustrates a block diagram of one embodiment of a modulator.

FIG. 3 illustrates an example of an apparatus for synthesizing high-frequency signals by implementing a phase-locked loop frequency synthesizer with a voltage-controlled oscillator.

As shown in FIG. 3, a sigma-delta modulator and digital to analog converter circuit 300 receives a Gaussian frequency shifted key signal. The sigma-delta modulator and digital to analog converter circuit 300 modulates and converts the signal to an analog signal. Upon leaving the sigma-delta modulator and digital to analog converter circuit 300, the analog signal is filtered by lowpass filter 302. The filtered signal is scaled by programmable gain amplifier 304 and then attenuated by modulation attenuation circuit 306 before being fed into a summing circuit 312.

The programmable gain amplifier 304 will be discussed in more detail with respect to FIG. 4. The summing circuit 312 may be any general summer circuit.

FIG. 3 further illustrates a phase-locked loop. The phase-locked loop includes a phase frequency detector and charge pump circuit 334, a phase and frequency detector 330, and a charge pump 332. The phase and frequency detector 330 produces an output proportional to the phase difference between a frequency source 326 and a signal from an integer-N divider 318. Based upon the output from the phase and frequency detector 330, the charge pump 332 is controlled to output a predetermined current to a loop filter 310. In a preferred embodiment, the charge pump 332 is programmable to one of five levels.

The signal from the loop filter 310 is fed to summing circuit 312 and modulator gain calibration circuit 308. The modulator gain calibration circuit 308 will be discussed in more detail with respect to FIG. 5. The summed signal from summing circuit 312 is fed to a voltage-controlled oscillator 314, which produces an output frequency based upon the received voltage.

The output frequency is fed back through the phase-locked loop through prescaler 316. The scaled signal is fed to integer-N divider 318. The integer-N divider 318 divide setting is controlled by a signal from a sigma-delta modulation circuit 320. The sigma-delta modulation circuit is connected to a summer circuit 322 that sums a channel signal with a signal from a modulation scaling circuit 324. The modulation scaling circuit 324 scales a Gaussian frequency shifted key signal to produce the desired modulation frequency offset.

In operations, the device of FIG. 3, during transmit, the voltage-controlled oscillator 314 is modulated by Gaussian frequency shifted key data by summing an appropriate signal into the voltage-controlled oscillator 314 control voltage input and into the sigma-delta modulator input. The phase-locked loop responds to the modulation within the phase-locked loop's bandwidth and attempts to cancel out the modulation. Employing the two-point modulation illustrated in FIG. 3 mitigates this effect.

The modulation is applied to the voltage-controlled oscillator 314 using the sigma-delta modulator/digital to analog converter (300), lowpass filter (302), programmable gain amplifier (304), modulation attenuation network (306), and summer 312 path. As noted above, the sigma-delta modulator/digital to analog converter 300 output is lowpass filtered, scaled to compensate for changes in the voltage-controlled oscillator Kv, attenuated, and then applied to the voltage-controlled oscillator 314. The input digital signal is also summed into the phase-locked loop sigma-delta modulator after appropriate scaling through the path comprising the modulation scaling circuit 324, summer circuit 322, and sigma-delta modulation circuit 320.

Figure 8:
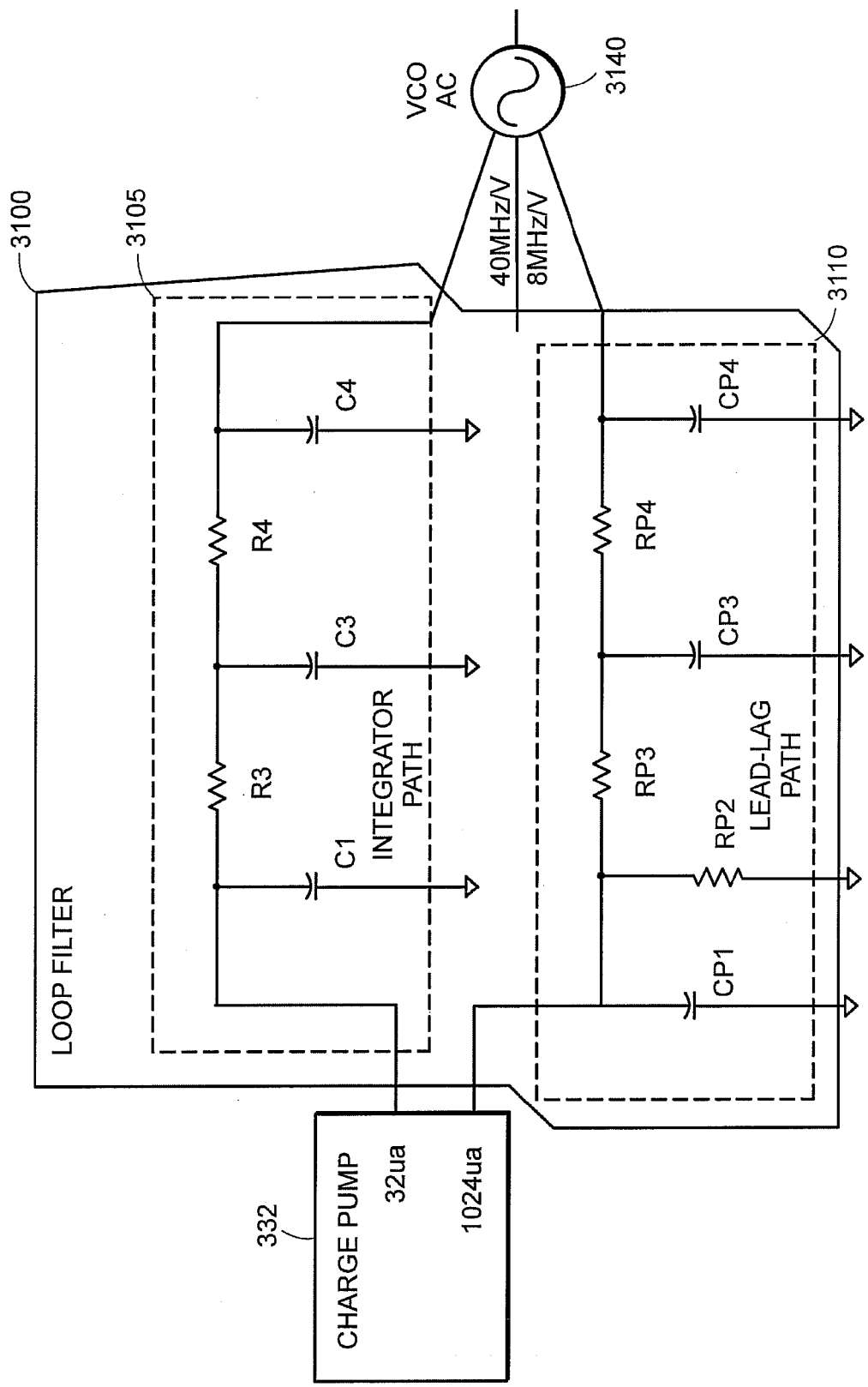
FIG. 8 illustrates an embodiment of a dual path loop filter according to the concepts of the present invention.

FIG. 8 illustrates an embodiment of a phase-locked loop filter. As illustrated in FIG. 8, the phase-locked loop filter 3100 has a dual path leading in from the charge pump 332. A first path is an integrator path 3105 and a lead-lag path 3110. The integrator path 3105 includes an RC circuit having resistors, r3 & r4, and capacitors, c1, c3 & c4. The lead-lag path 3110 includes an RC circuit having resistors, rp2, rp3 & rp4, and capacitors, cp1, cp3 & cp4. By separating the loop filter integrator from the loop filter lead-lag network, the loop filter of FIG. 8 enables the use of capacitors and resistors that have small values, thereby reducing the additive phase noise.

Figure 4:
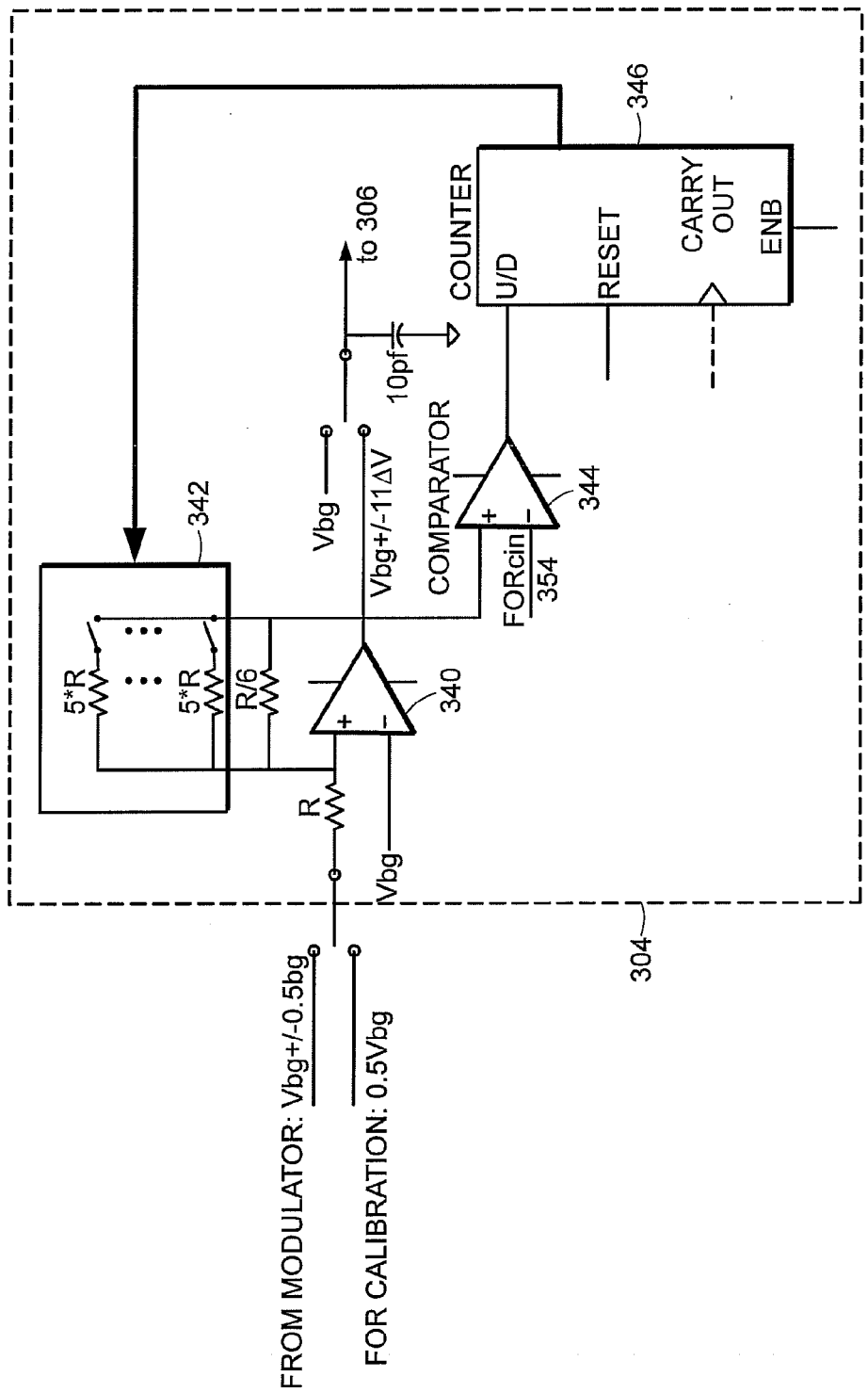
FIG. 4 illustrates an embodiment of a programmable gain amplifier for a modulator.

FIG. 4 illustrates an embodiment of a programmable gain amplifier 304. The programmable gain amplifier 304 includes an amplifier 340 that has a switch, which switches between the lowpass filter 302 and a reference calibration signal, and a programmable feedback resistor bank 342 connected to one input and a reference signal connected to another input. The output of amplifier 340 is connected to another switch, which switches between the output of the amplifier 340 or a reference signal being applied to the modulation attenuation circuit 306, and the programmable feedback resistor bank 342.

The output of amplifier 340 is also connected to a comparator 344, which compares the output of the amplifier 340 with a signal from the modulation gain calibration circuit 308. The results of the comparison from comparator 344 are fed to an up/down control input of a counter 346. The counter 346 produces a count value in response thereto, wherein the count value is used to control the programmable feedback resistor bank 342.

To calibrate, the programmable gain amplifier 304 input is switched to 0.5Vbg, wherein Vbg is equal to the bandgap voltage, resulting in the programmable gain amplifier 304 output voltage to be Vbg+0.5Vbg*$G_{PGA}$, wherein $G_{PGA}$ is the gain of the programmable gain amplifier 304. The output voltage is compared to Vbg plus the voltage necessary at the programmable gain amplifier's 304 output to produce a frequency shift in the voltage-controlled oscillator. The comparator's 344 output connects to an up/down counter 346. The gain of the programmable gain amplifier 304 is adjusted such that a full-scale input to the programmable gain amplifier 304 will result in a frequency deviation of the voltage-controlled oscillator through the voltage-controlled oscillator modulation network.

Figure 6:
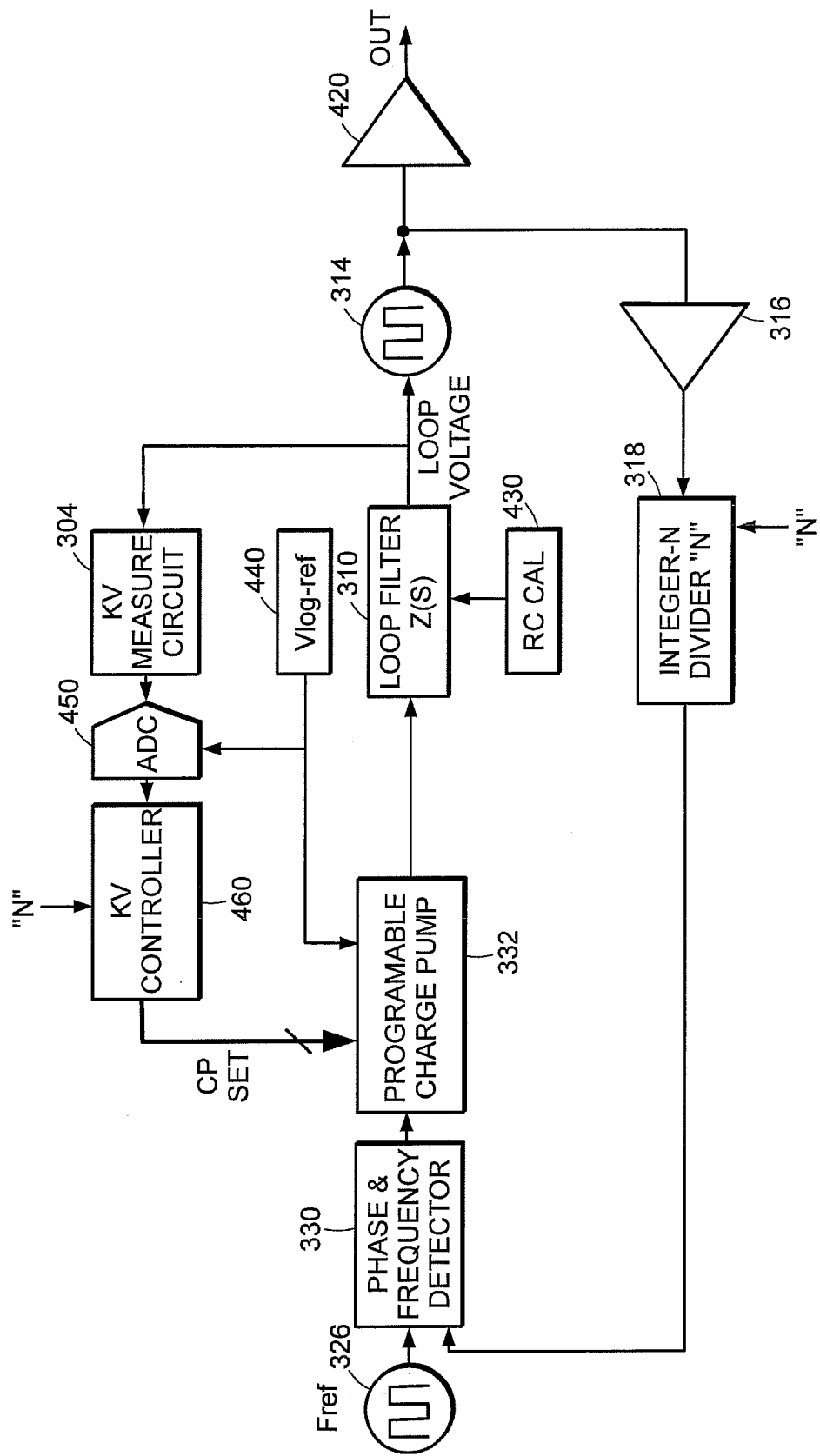
FIG. 6 illustrates an embodiment of a phase-locked loop bandwidth calibration circuit according to the concepts of the present invention

FIG. 6 illustrates an embodiment of a phase-locked loop frequency synthesizer with a voltage-controlled oscillator that synthesizes high-frequency signals according to the concepts of the present invention.

As shown in FIG. 6, a phase-locked loop includes a phase frequency detector 330 and a charge pump circuit 332. The phase and frequency detector 330 produces an output proportional to the phase difference between a frequency source 326 and a signal from an integer-N divider 318. Based upon the output from the phase and frequency detector 330 and control data received from a Kv controller circuit 460, the charge pump 332 is controlled to output a predetermined current level to a loop filter 310.

The signal from the loop filter 310 is fed to a voltage-controlled oscillator 314, which produces an output frequency based upon the received voltage. The output frequency is fed back through the phase-locked loop through buffer 316. The scaled signal is fed to integer-N divider 318.

As further illustrated in FIG. 6, a bandwidth calibration path is included. The bandwidth calibration path includes a Kv measuring circuit 304, which is used to measure the calibration voltage, connected to the output of the loop filter 310. The Kv measuring circuit 304 will be explained in more detail below with respect to FIG. 5.

The output of Kv measuring circuit 304 is fed to an analog to digital converter 450 that uses Vbg as its reference voltage to generate a digital value corresponding to the measured Kv. The digital value from the analog to digital converter 450 is fed to a Kv controller 460 that, in response to the received digital value and a received N value, produces control data that is used by the programmable charge pump 332 to control the level of the signal being fed to the phase-locked loop filter 310. The detail operations of these elements and the overall path will be discussed in more detail below.

It is noted that the Kv controller 460 may be a lookup table that has pre-stored control data that is fed to the programmable charge pump 332 based the received digital value and the programmed N value. It is noted that the Kv controller 460 may also be a hardwire circuit or firmware that generates the control data in real-time based the measured digital value and the programmed N value.

Moreover, as illustrated in FIG. 6, the phase-locked loop includes a RC calibration circuit 430. The RC calibration circuit 430 calibrates the pole & zero frequencies inside the phase-locked loop filter 310, setting the pole & zero frequencies precisely based on an external frequency reference and using a oscillator whose frequency is determined by the R*C product, a frequency difference detector, and a successive approximation register algorithm similar to the voltage-controlled oscillator center frequency calibration discussed in more detail below.

In a preferred embodiment of the present invention, the RC calibration process for the phase-locked loop slaves off the calibration process of the time constants in the receiver lowpass filter. Since the receiver lowpass filter uses similar R's and C's to form R*C products as the phase-locked loop filter, the preferred embodiment of the present invention uses that calibration process to calibrate the phase-locked loop time constants.

Using this calibration process, the variations in R's and C's on phase-locked loop bandwidth drop out due to capacitor mis-match, and the resistor value is subsequently canceled by the resistor in the programmable charge pump 332.

This calibration process will be discussed in more detail below with respect to FIG. 9.

Figure 5:
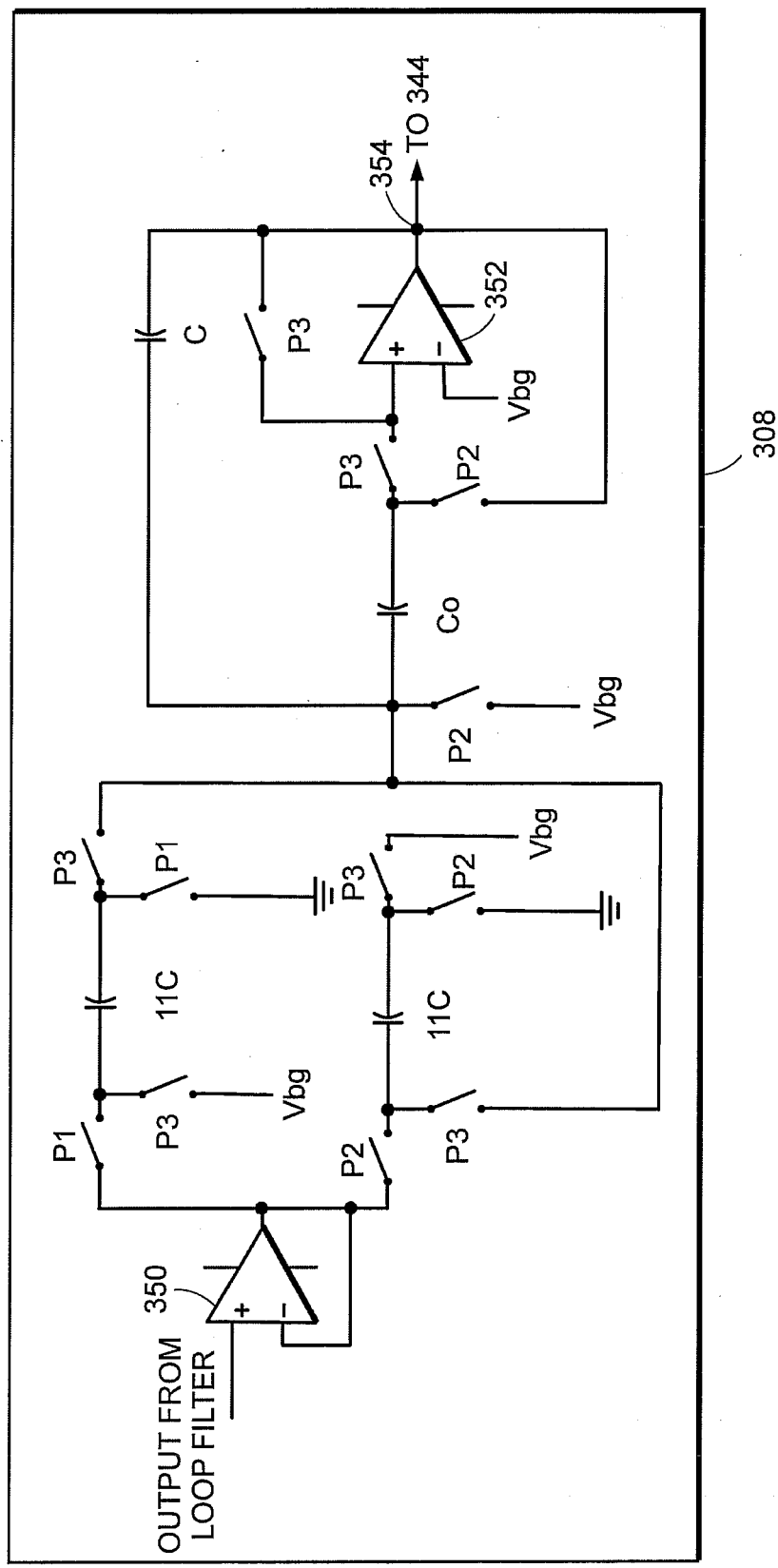
FIG. 5 illustrates an embodiment of a modulation gain calibration measuring circuit according to the concepts of the present invention.

FIG. 5 illustrates a circuit used to measure the gain of the oscillator or calibration voltage, Kv, in a preferred embodiment of the present invention. As illustrated in FIG. 5, a buffer amplifier 350 receives output from the phase-locked loop filter 310. Thereafter, a plurality of ganged switches (P1, P2 & P3) and capacitors (21C, 11C, C & $C_O$) are used to capture the calibration voltages. Another buffer amplifier 352 is used, along with a summer 354, to produce an output signal to be fed to the analog to digital converter 450 of FIG. 6.

In a preferred calibration operation, the circuit of FIG. 5 initially sets the phase-locked loop at a predetermine frequency offset and allows the phase-locked loop to settle. The voltage-controlled oscillator voltage is measured onto capacitor 21C by closing the ganged switches P1. The phase-locked loop is then reprogrammed to the channel center and again allowed to settle. The voltage-controlled oscillator voltage is sampled onto capacitor 11C by closing ganged switches P2. The two voltages are then subtracted and scaled up by 22 for PCS/DCS band or by 44 for GSM/GSM850 bands.

Figure 7:
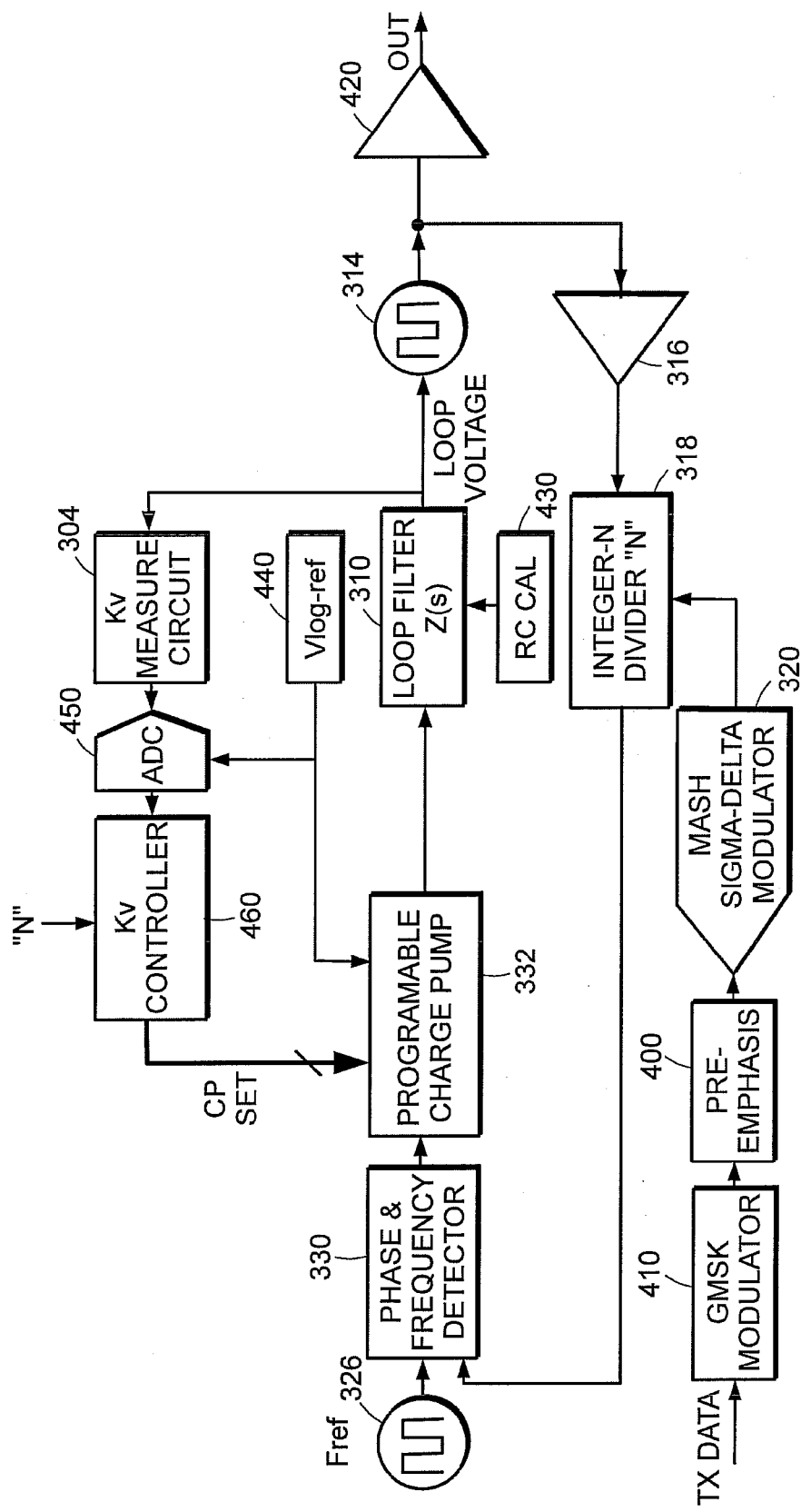
FIG. 7 illustrates an embodiment of a modulator with a phase-locked loop bandwidth calibration circuit according to the concepts of the present invention.

FIG. 7 illustrates an embodiment of the present invention that includes the phase-locked loop frequency synthesizer of FIG. 6 in conjunction with a modulator to synthesize high-frequency signals according to the concepts of the present invention.

As shown in FIG. 7, a phase-locked loop includes a phase frequency detector 330 and a pump charge circuit 332. The phase and frequency detector 330 produces an output proportional to the phase difference between a frequency source 326 and a signal from an integer-N divider 318. Based upon the output from the phase and frequency detector 330 and control data received from a Kv controller circuit 460, the charge pump 332 is controlled to output a predetermined current to a loop filter 310.

The signal from the loop filter 310 is fed to a voltage-controlled oscillator 314, which produces an output frequency based upon the received voltage.

The output frequency is fed back through the phase-locked loop through prescaler 316. The scaled signal is fed to integer-N divider 318. The integer-N divider 318 divides the VCO output frequency with a value set by the sigma-delta modulation circuit 320. The sigma-delta modulation circuit is connected to a pre-emphasis circuit 400 that conditions a signal from a Gaussian frequency shifted key modulator 410.

As further illustrated in FIG. 7, a bandwidth calibration path is included. The bandwidth calibration path includes a Kv measuring circuit 304, which is used to measure the calibration voltage, connected to the output of the loop filter 310.

The output of Kv measuring circuit 304 is fed to an analog to digital converter 450 that uses Vbg as its reference voltage to generate a digital value corresponding to the measured Kv. The digital value from the analog to digital converter 450 is fed to a Kv controller 460 that, in response to the received digital value and a received N value, produces control data that is used by the programmable charge pump 332 to control the signal being fed to the loop filter 310. Moreover, as illustrated in FIG. 7, the phase-locked loop includes a RC calibration circuit 430.

It is noted that the Kv controller 460 may be a lookup table that has pre-stored control data that is fed to the programmable charge pump 332 based the received digital value and the received N value from the integer-N divider 318. It is noted that the Kv controller 460 may also be hardwire circuit or firmware that generates the control data in real-time based the received digital value and the received N value.

Figure 9:
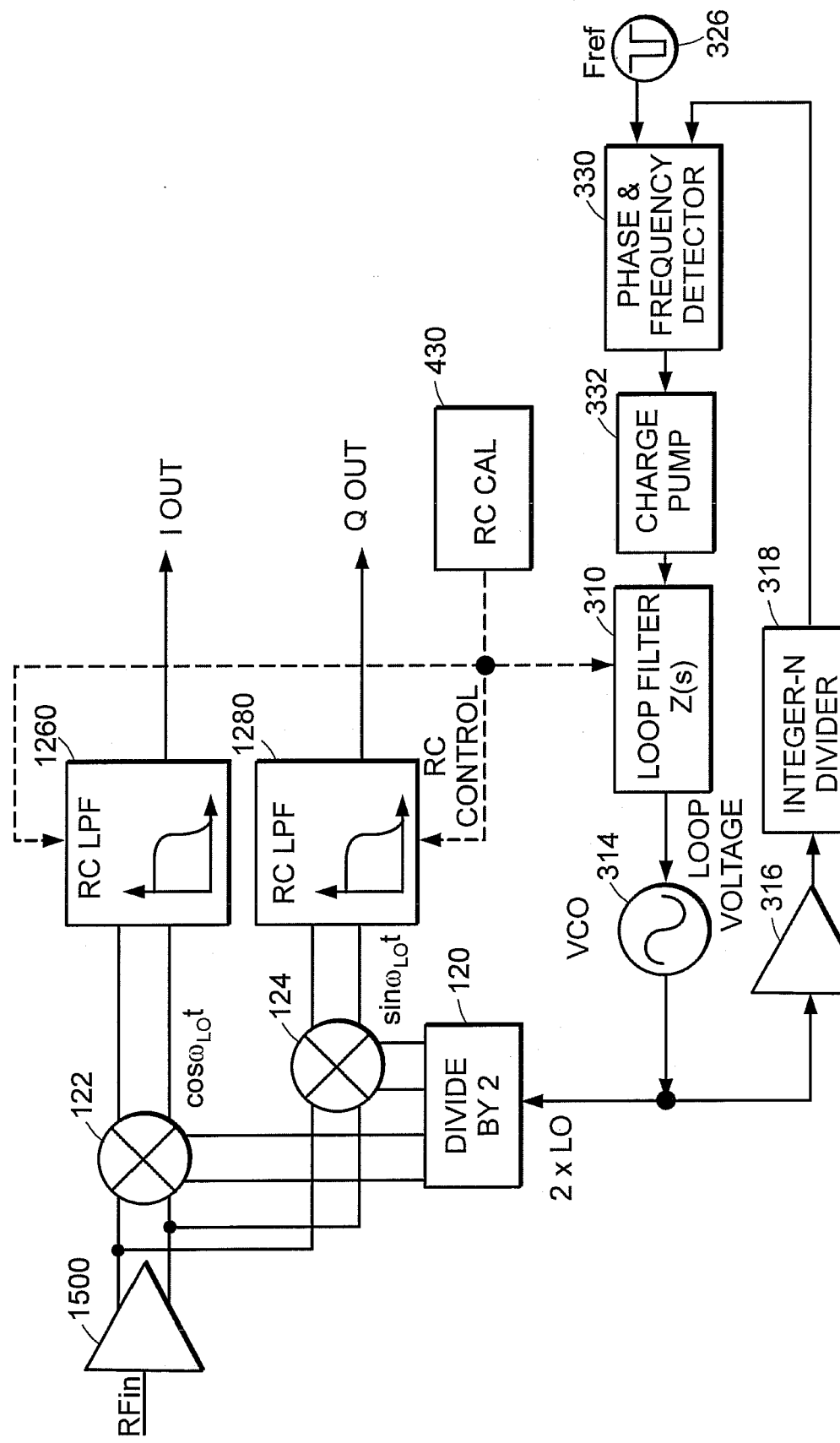
FIG. 9 illustrates a phase-locked loop used in conjunction with a receiver utilizing a same RC calibration circuit according to the concepts of the present invention.

FIG. 9 is a block diagram example of a phase-locked loop used in conjunction with a receiver utilizing a same RC calibration circuit according to the concepts of the present invention. An incoming signal, received by an antenna, is filtered and amplified by a receiver unit 1500. This incoming signal is typically a radio-frequency signal, for example a 900 MHz or 1800 MHz signal.

The radio-frequency signal is usually mixed down to a desired intermediate frequency by the receiver unit 1500 before being mixed down to baseband by mixers 122 and 124.

Signal processing in mobile phones is typically conducted at baseband using in-phase (I) and quadrature (Q) signals. The Q signal is offset from the I signal by a phase shift of 90 degrees. To provide these two signals, a dual divide-by-two and quadrature shift block 120 may be utilized. A frequency synthesizer, as represented by a phase-locked loop, generates a signal; for example, at about 500 MHz; that is divided by 2 and phase-shifted in block 120 to provide mixing signals for mixers 122 and 124.

The phase-locked loop includes a phase frequency detector 330 and a pump charge circuit 332. The phase and frequency detector 330 produces an output proportional to the phase difference between a frequency source 326 and a signal from an integer-N divider 318. Based upon the output from the phase and frequency detector 330 and control data received from a Kv controller circuit 460, the charge pump 332 is controlled to output a predetermined current level to a loop filter 310.

The signal from the loop filter 310 is fed to a voltage-controlled oscillator 314, which produces an output frequency based upon the received voltage. The output frequency is fed back through the phase-locked loop through prescaler 316. The scaled signal is fed to integer-N divider 318.

A preferred embodiment of this phase-locked loop, as illustrated in FIG. 6, includes a bandwidth calibration path. The bandwidth calibration path includes a Kv measuring circuit, which is used to measure the calibration voltage, connected to the output of the loop filter 310.

The output of Kv measuring circuit is fed to an analog to digital converter that uses Vbg as its reference voltage to generate a digital value corresponding to the measured Kv. The digital value from the analog to digital converter is fed to a Kv controller that, in response to the received digital value and a received N value, produces control data that is used by the programmable charge pump 332 to control the level of the signal being fed to the phase-locked loop filter 310. Moreover, as illustrated in FIG. 9, a RC calibration circuit 430 is included.

As noted above, the RC calibration circuit 430 calibrates the pole & zero frequencies inside the phase-locked loop filter 310, setting the pole & zero frequencies precisely based on an external frequency reference and using a oscillator whose frequency is determined by the R*C product, a frequency difference detector, and a successive approximation register algorithm similar to the voltage-controlled oscillator center frequency calibration discussed in more detail below.

In a preferred embodiment of the present invention, the RC calibration process for the phase-locked loop slaves off the calibration process of the time constants in the receiver lowpass filter. Since the receiver's lowpass filter uses similar R's and C's to form R*C products as the phase-locked loop filter, the preferred embodiment of the present invention uses that calibration process to calibrate the phase-locked loop time constants.

Using this calibration process, the variations in R's and C's on phase-locked loop bandwidth drop out due to capacitor mis-match, and the resistor value is subsequently canceled by the resistor in the programmable charge pump 332.

Assuming the baseband frequency is centered at DC, the signal is filtered using low-pass filters 1260 and 1280. The resulting baseband signals are $I_{OUT}$ and $Q_{OUT}$.

These signals may be further processed at baseband and provided to the rest of the mobile phone circuitry.

The operations of a preferred embodiment of the present invention will now be explained in more detail to provide a better understanding of the concepts thereof.

As noted above, phase-locked loop circuits are used in many applications, for example in frequency synthesis, data clock regeneration, frequency tracking, clock skew removal, and many others. In these applications the phase-locked loop bandwidth is a key parameter in setting the circuit performance. In radio applications a phase lock loop is typically used to generate the local oscillator. The phase-locked loop bandwidth sets such performance metrics as spurious level, residual noise, and settling time performance. Generally, a lower bandwidth is preferred to reduce noise and spurs while a wider bandwidth is preferred to reduce settling time. Thus, it is desirable to provide an accurate and quick calibration of the phase-locked loop bandwidth without the need for expensive trimming or manual intervention.

To provide this calibration, the present invention measures the difference in loop voltage while applying a step in frequency in the phase-locked loop (while locked). This voltage is then used to adjust the charge pump current such that the open loop gain is relatively constant thus resulting in a constant phase-locked loop bandwidth. Since the voltage-controlled oscillator gain varies with center frequency, this calibration is performed each time the phase-locked loop is programmed to a new frequency.

In addition, the loop filter time constants (pole and zero locations) are also calibrated. An oscillator is constructed using representative R-C values where the oscillation frequency is set by the R-C product. The oscillator frequency is compared to an external reference and the capacitor value is digitally adjusted until a close match is found. This digital value is then held in a register and used to adjust the similar capacitors the lowpass filters 1260 and 1280 of FIG. 9. Since the lowpass filters' pole/zero locations are also determined by an appropriately scaled R-C, the lowpass filters' pole/zero locations are calibrated. Once the poles/zeroes of the low pass filters 1260 and 1280 of FIG. 9 are calibrated, the pole/zero of the phase-locked loop filter can be slaved from this calibration and set appropriately.

The phase-locked loop bandwidth calibration employs, in a preferred embodiment, a 4-phase calibration technique. In the first phase, the R-C time constant is measured and set as mentioned above. It noted that this step is not absolutely necessary. Secondly, the phase-locked loop tuning voltage is measured when the phase-locked loop center frequency is offset by a fixed and known amount.

Next, the phase-locked loop frequency is programmed to the correct channel and the loop filter voltage is again measured. This voltage is then subtracted from the previously measured voltage, amplified, and converted to a digital value using an analog to digital converter. Finally, the phase-locked loop bandwidth is adjusted by modifying the charge pump current based on the analog to digital converter output using a value stored in a look-up-table.

Utilizing this preferred embodiment of the present invention in a fully integrated GSM radio solution, the present invention can meet the settling time requirements in GSM-5.05 of 200 s. In this application the loop filter time constant is measured after power-up and held until the radio is powered off. The loop filter voltage measurement (Kv) and associated digitations are made in 96 s. The entire procedure can be accomplished and the phase-locked loop settled within the 200 s allocated. This includes the 32 s needed to calibrate the voltage-controlled oscillator center frequency.

To provide a better understanding of the need to calibrate the phase-locked loop bandwidth, a brief discussion of the mathematics will be presented below.

Given a phase-locked loop open-loop gain of $G_{OL}(s)$, the phase-locked loop closed loop bandwidth is approximately equal to the frequency for which $G_{OL}(s)=1$. Regardless of the exact closed loop response, it is entirely determined by $G_{OL}(s)$. So, control of $G_{OL}(s)$ will control the phase-locked loop closed-loop response.

The phase-locked loop open-loop gain as a function of loop components is:

$$Gol(s) = \frac{Kvco * K\phi * Z(s)}{N * s}$$

The parameters, Kvco, K, Z(s), and N, are the voltage-controlled oscillator gain, the phase-frequency detector gain, the loop filter input impedance, and the phase-locked loop divider value, respectively.

For a standard $2^{nd}$ order phase-locked loop, Z(s) is given by:

$$Z(s) = \frac{(1 + sT2)}{s * (C1 + C2) * (1 + sT1)}$$

where T1=R2*C1*C2/(C1+C2) and T2=R2*C2.

The phase-locked loop closed loop response is dominated by the open-loop response near the point where $G_{OL}(s)=1$. A well-designed phase-locked loop will exhibit good phase margin to minimize noise peaking and maximize stability. Under these conditions T2 is generally much smaller than the phase-locked loop bandwidth while T1 is generally much higher (in both cases by a factor of 3 or more). With this assumption the open loop gain near crossover (where the gain drops from greater than 1 to less than 1) is given by:

$$Gol(s \approx 1) = \frac{Kvco * K\phi * R2 * kc}{N * s}$$

where kc=C2/(C1+C2)

So, the phase-locked loop $G_{OL}$, given above, is a function of the capacitor ratio kc and the value of R2. The charge pump gain constant is generally set using a voltage reference and resistor:

$$K\phi = \frac{Vref * ni}{2\pi Rset}$$

In the above expression, ni is a programmable (binary) value and Rset can be made similar to R2.

If the ratio R2/Rset=kr, Gol reduces to:

$$Gol(s \approx 1) = \frac{Kvco * Vref * ni * kr * kc}{2\pi * N * s}$$

The expression above reveals an extremely important aspect of the phase-locked loop bandwidth. In a properly designed phase-locked loop, the bandwidth is independent of the R's and C values in the loop filter and only dependant on the voltage-controlled oscillator's gain Kvco, the voltage reference Vref, and the well controlled or deterministic parameters ni, kr, and kc.

In addition to the above, it will be shown below that through the calibration procedure of the present invention, the phase-locked loop bandwidth can also be made independent of Vref and Kvco.

It is noted that the phase-locked loop open-loop gain has the following component variations:

1: Variations in Kvco. This is expected to be the biggest source of error at +/−50%. However, this error source is calibrated and only the measurement error and compensation circuit are important 2: Variations in pole and zero locations; i.e., R-C time constants. This is expected to play only a minor role in the closed loop response since any change in R is tracked out in the charge pump and the R-C time constants are calibrated using the calibration circuit. Additionally, the phase-locked loop bandwidth is not particularly sensitive to the pole & zero locations.

3: Charge pump variations that can be decomposed into:
  i: Bandgap reference voltage variations (Vref)
  ii: Resistor mismatch between charge pump and phase-locked loop filter.
  iii: Current source mismatch & charge pump mismatch.

It is further noted that, in a preferred embodiment of the present invention, the bandgap voltage error is cancelled by using the bandgap voltage as the reference for the analog to digital converter used during Kv measurement. The residual error is expected to be calibrated to +/−1%. Resistor mismatch is also expected to be ~+/−0.5%, and charge pump current source compliance is ~+/−1.5%. The table below summarizes the post-calibration error budget for Gol:

| PARAMETER | GOL % ERROR | COMMENTS |
| --- | --- | --- |
| Kv measure circuit | +/−2 | Worst Case |
| Kv ADC | +/−0.5 | 8 Bit analog to digital converter |
| LUT Error & CP Quantization | +/−1.5 | Also compensates for 1/N |
| Resistor Mismatch | +/−0.5 | Between charge pump, phase-locked loop filter. |
| Loop Filter pole-zero error | +/−1 | Auto-calibration circuit error +/−3%. |
| Charge pump Compliance | +/−1.5 | Up/Down Mismatch, Voltage Compliance, and Charge pump Matching |
| Bandgap | +/−1 | Residual |
| TOTAL | +/−8 | Worst Case |

Back to the calibration process of the preferred embodiment of the present invention, the calibration process first measures the Kv or Kvco and then adjusts the charge pump current to produce a constant Kvco*K/Navg product.

The calibration voltage is measured using the circuit shown in FIG. 5. First, the phase-locked loop is set at a local oscillator offset of 13 MHz/96=135.416 kHz and allowed to settle. The voltage-controlled oscillator voltage is measured. The phase-locked loop is then reprogrammed to the channel center and again allowed to settle. The voltage-controlled oscillator voltage is sampled again. The two voltages are then subtracted and scaled up by 22 or 44 to compensate the effect of high-band vs. low-band gain.

The Kv or Kvco measurement circuit output voltage as a function of band and Kv is then:

| Mode | Kv-min/max | F | Vloop-min/max | Gain | Vout-min/max |
| --- | --- | --- | --- | --- | --- |
| PCS/DCS | 20/80 MHz/V | 2/Ts | 3.48 mv/ 13.5 mv | 44 | 149 mv/ 596 mv |
| GSM | 20/80 MHz/V | 4/Ts | 6.8 mv/ 27.0 mv | 22 | 149 mv/ 596 mv |

The analog to digital converter digitizes Vout to produce all zeros for Vout=149 mv and all ones for Vout=596 mv.

Mathematically, the Kv measure circuit output voltage as a function of Kv is:

$$\Delta Vout = \frac{(13M/96)*88}{K_V}$$

The ADC output code is:

$$ADCout = \frac{(\Delta Vout - 0.15)}{0.447 * kref} * 255,$$

$$0.15 = \frac{(13M/96)*88}{2*K_v nom}, \quad 0.447 = 1.5 * \frac{(13M/96)*88}{K_v nom}$$

where kref=Vref/Vref_nom

The LUT output is:

$$LUTout = 127 * \frac{N}{Nnom} * \left(0.5 + \frac{ADCout * 1.5}{255}\right)$$

The charge pump current is then:

$$Ipump = Inom * \frac{LUTout}{127} = Inom * \frac{K_V nom}{Kv} * \frac{N}{Nnom} * \frac{Vref\_nom}{Vref}$$

By substitution of the above into the Gol expression derived earlier, the phase-locked loop bandwidth is:

$$PLL_{BW} = \frac{K_v nom * Vref\_nom * kr * kc}{2\pi * Nnom * s}$$

The equation above shows that the procedure completely compensates for Kv, Vref, and N variations in the phase-locked loop, resulting in a fixed bandwidth independent of variation in these parameters. The resistor ratio kr and capacitor ratio kc can be well-controlled on-chip due to the inherent matching from integrated resistor and capacitors.

It is also noted that the loop filter time constants do not absolutely need to be calibrated for the above procedure to work. So long as the zero is much lower than the bandwidth and the pole is much higher, the present invention will still work. The primary benefit of the loop filter calibration is that it allows for the zero and pole to approach the phase-locked loop bandwidth without large effect.

It is noted that the bandwidth calibration circuit and technique, according to the concepts of the present invention, can be utilized in transmitters and receivers (for the local oscillator) where the modulation is not induced through the phase-locked loop. In other words, the concepts of the present invention can be utilized in all types of systems having phase-locked loops, not just those systems that use the phase-locked loop as a modulator.

In summary, the present invention provides a means of setting a phase-locked loop bandwidth quickly using only an external frequency reference. The technique can be widely applied in any application where a sufficiently accurate external frequency reference is available. It will allow for better circuit performance by eliminating the need to have margin on the phase-locked loop bandwidth. The present invention can be used in GSM radios, phase-locked loop synthesizers, and wireless infrastructure products as well as in WLAN applications.

In utilizing the concepts of the present invention, the phase-locked loop bandwidth, which typically varies by +/−80% can be reduced to a variation +/−3%. Reduction in the variation results in better control of phase-locked loop settling time and in phase-locked loop noise.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. A phase-locked loop bandwidth calibration circuit, comprising:
   a programmable charge pump;
   a phase-locked loop filter operatively connected to said programmable charge pump;
   an oscillator, operatively connected to said phase-locked loop filter, to generate a frequency signal based upon a signal received from said phase-locked loop filter; and
   a control loop operatively connected to said phase-locked loop filter and said programmable charge pump;
   said control loop including a gain measurement circuit, operatively connected to said oscillator, to measure a gain of said oscillator;
   said control loop controlling said programmable charge pump to adjust its output current level based on the measured gain of said oscillator;
   said gain measurement circuit including,
   a voltage difference measurement circuit, operatively connected to said phase-locked loop filter, to measure a voltage difference corresponding to two voltages being output from said phase-locked loop filter at different times,
   an analog to digital converter, operatively connected to said voltage difference measurement circuit, to convert the measured voltage difference into a digital signal, and
   a controller to cause said programmable charge pump to adjust its output current level based upon a received digital signal from said analog to digital converter.

2. The phase-locked loop bandwidth calibration circuit as claimed in claim 1, wherein said control loop controls said programmable charge pump to adjust its output current level so that the product of the measured gain and a charge pump current level is kept constant.

3. The phase-locked loop bandwidth calibration circuit as claimed in claim 1, further comprising:
   a voltage reference circuit, operatively connected to said programmable charge pump and said analog to digital converter, to generate and apply a same reference voltage to said programmable charge pump and said analog to digital converter based upon changes in a reference voltage.

4. The phase-locked loop bandwidth calibration circuit as claimed in claim 1, further comprising:
   an integer-N divider operatively connected to an output of said oscillator; and
   a phase and frequency detector operatively connected between said integer-N divider and said programmable charge pump.

5. The phase-locked loop bandwidth calibration circuit as claimed in claim 4, wherein said control loop controls said programmable charge circuit to adjust its output current level so that the product of the measured gain and a charge pump current level divided by an average N value, said N value being provided by said integer-N divider, is kept constant.

6. The phase-locked loop bandwidth calibration circuit as claimed in claim 1, further comprising:
   an integer-N divider operatively connected to an output of said oscillator;
   a sigma-delta-modulator operatively connected to said integer-N divider; and
   a phase and frequency detector operatively connected between said integer-N divider and said programmable charge pump.

7. The phase-locked loop bandwidth calibration circuit as claimed in claim 6, wherein said control loop controls said programmable charge pump to adjust its output current level so that the product of the measured gain and a charge pump current level divided by an average N value, said N value being provided by said integer-N divider, is kept constant.

8. The phase-locked loop bandwidth calibration circuit as claimed in claim 1, wherein said phase-locked loop filter includes a capacitor; a charging circuit to pre-charge said capacitor to a voltage of said phase-locked loop filter; and a switch to switch said capacitor into the phase-locked loop filter circuit to effect a phase-locked loop bandwidth.

9. The phase-locked loop bandwidth calibration circuit as claimed in claim 1, wherein said phase-locked loop filter includes a dual path having an integrator path and a lead-lag path.

10. The phase-locked loop bandwidth calibration circuit as claimed in claim 9, wherein said programmable charge pump provides a first current output level to said integrator path and a second current output level to said lead-lag path.

11. A phase-locked loop bandwidth calibration circuit, comprising:
    a programmable charge pump;
    a phase-locked loop filter operatively connected to said programmable charge pump;
    an oscillator, operatively connected to said phase-locked loop filter, to generate a frequency signal based upon a signal received from said phase-locked loop filter;
    a control loop operatively connected to said phase-locked loop filter and said programmable charge pump;
    said control loop including a gain measurement circuit, operatively connected to said oscillator, to measure a gain of said oscillator;
    said control loop controlling said programmable charge pump to adjust its output current level based on the measured gain of said oscillator;
    a programmable gain amplifier;
    a comparator for comparing a voltage of an output from said programmable gain amplifier with a voltage necessary to produce a predetermined frequency shift in said oscillator to produce a gain signal; and
    a gain controller, in response to said gain signal produced by said comparator, to control a gain of said programmable gain amplifier.

12. The phase-locked loop bandwidth calibration circuit as claimed in claim 11, wherein said gain controller includes a counter and a plurality of resistors, said plurality of resistors being switchable into or out of a circuit connected between an output of said programmable gain amplifier and an input of said programmable gain amplifier.

13. The phase-locked loop bandwidth calibration circuit as claimed in claim 11, wherein said gain controller controls the gain of said programmable gain amplifier such that a full scale input to said programmable gain amplifier produces said predetermined frequency shift in said oscillator.

14. A method of calibrating a phase-locked loop bandwidth, comprising:
    (a) setting a phase-locked loop at a local oscillator offset;
    (b) allowing the phase-locked loop to settle;

(c) measuring, after allowing the phase-locked loop set to the local oscillator offset to settle, a first voltage of a voltage-controlled oscillator located in the phase-locked loop;

(d) setting the phase-locked loop to a channel center frequency;

(e) allowing the phase-locked loop to settle;

(f) measuring, after allowing the phase-locked loop set to the channel center frequency to settle, a second voltage of the voltage-controlled oscillator;

(g) determining a difference between the first and second voltage measurements; and (h) controlling a programmable charge circuit located in the phase-locked loop to adjust its output current level based on the determined voltage difference.

15. The method as claimed in claim 14, wherein the programmable charge circuit adjusts its output current level so that the product of a measured gain and a charge pump current level is kept constant.

* * * * *